United States Patent
Miyazaki et al.

[11] Patent Number: 5,976,983
[45] Date of Patent: Nov. 2, 1999

[54] METHOD OF CLEANING SEMICONDUCTOR WAFERS AFTER LAPPING

[75] Inventors: Seiichi Miyazaki; Sumiyoshi Okada, both of Nagano-ken, Japan

[73] Assignee: Shin-Etsu Handotai Co., Ltd., Tokyo, Japan

[21] Appl. No.: 09/020,914

[22] Filed: Feb. 9, 1998

[30] Foreign Application Priority Data

Feb. 21, 1997 [JP] Japan ................................. 9-054099

[51] Int. Cl.⁶ ................................................ H01L 21/304
[52] U.S. Cl. ........................... 438/692; 438/745; 438/753
[58] Field of Search .................................. 438/753, 460, 438/692

[56] References Cited

U.S. PATENT DOCUMENTS

| | | | |
|---|---|---|---|
| 4,918,030 | 4/1990 | Lamb et al. | 438/71 |
| 5,360,509 | 11/1994 | Zakaluk et al. | 117/106 |
| 5,494,862 | 2/1996 | Kato et al. | 438/753 |

FOREIGN PATENT DOCUMENTS

A-0 628 992 12/1994 European Pat. Off. .

*Primary Examiner*—Benjamin Utech
*Assistant Examiner*—Lynette T. Umez-Eronini
*Attorney, Agent, or Firm*—Oliff & Berridge, PLC

[57] ABSTRACT

There is disclosed a method of cleaning a semiconductor wafer after lapping in the manufacture thereof comprising the steps of slicing a monocrystalline ingot into a semiconductor wafer, and chamfering, lapping, acid-etching, and then mirror-polishing the thus-obtained semiconductor wafer. The semiconductor wafer is cleaned in a strong-alkaline aqueous solution at a point of time after the lapping and before the acid-etching, such that the surface of the semiconductor wafer is dissolved in an amount in the range of 4–8 $\mu$m. The cleaning method prevents generation of a protrusion on the outer circumferential end portion of the wafer in the subsequent acid-etching step.

19 Claims, 1 Drawing Sheet

METHOD OF CLEANING SEMICONDUCTOR WAFERS AFTER LAPPING

BACKGROUND OF THE INVENTION

1. Field of the Invention

The present invention relates to an improvement in a method of cleaning semiconductor wafers in a strong-alkaline aqueous solution at a point of time after lapping and before etching in the manufacture of semiconductor wafers of silicon, GaAs, GaP, InP, or the like.

2. Description of the Related Art

Generally, the manufacture of semiconductor mirror-polished wafers is composed of the steps of slicing a monocrystalline ingot of silicon or the like into semiconductor wafers; and chamfering, lapping, acid-etching, and then mirror-polishing the thus-obtained semiconductor wafers.

In the manufacture of semiconductor mirror-polished wafers, various substances adhere to semiconductor wafers which have undergone lapping. Such adhering substances include heavy metal; lapping powder composed of aluminum oxide, silicon carbide, and the like; and a rust preventive contained generally in a lapping solution. In order to remove such adhering substances, lapped semiconductor wafers undergo cleaning before entering the subsequent acid-etching step. According to a conventionally employed cleaning method, before the acid-etching step, lapped semiconductor wafers are immersed in a strong-alkaline aqueous solution showing strong corrosion on wafers so as to slightly dissolve the surfaces of the wafers (amount of dissolution: approximately 1 $\mu$m to 2 $\mu$m) and to simultaneously remove adhering substances such as the lapping powder and rust preventive.

However, when a semiconductor wafer which has been cleaned in a strong-alkaline aqueous solution is acid-etched, as shown in FIG. 1, a protrusion 2 having a height of up to approximately 25 $\mu$m is generated on the outer circumferential end portion 1 of the semiconductor wafer.

Before a semiconductor wafer undergoes lapping, the outer circumferential end portion thereof undergoes chamfering. The chamfered outer circumferential end portion suffers excessive mechanical damage (depth: approximately 5 $\mu$m to 15 $\mu$m) induced by chamfering. As a result, when the semiconductor wafer is cleaned in a strong-alkaline aqueous solution, the outer circumferential end portion is selectively dissolved, resulting in the formation of a number of pits. Consequently, the surface of the outer circumferential end portion becomes rough.

When a semiconductor wafer having the thus-roughened outer circumferential end portion is sent to the subsequent acid-etching step, the roughened outer circumferential end portion scrapes a basket for conveying or cleaning semiconductor wafers. As a result, thus-produced scrapings of the basket adhere to the pits and serve as masks that thereby prevent etching of the corresponding portions, resulting in the generation of a protrusion.

Further, foreign matter trapped in the pits remains as contaminants even after the completion of acid-etching.

SUMMARY OF THE INVENTION

In view of the foregoing, an object of the present invention is to provide a method of cleaning a semiconductor wafer after lapping, which method prevents generation of a protrusion on the outer circumferential portion of the wafer in a subsequent acid-etching step.

Through various studies made by the inventors of the present invention in light of the aforementioned drawbacks in the art, the inventors have discovered the following phenomena: when a semiconductor wafer is cleaned in a strong-alkali aqueous solution, by dissolving the surface of the semiconductor wafer in an amount of at least 4 $\mu$m, not 1 to 2 $\mu$m as practiced conventionally, the generation of a protrusion can be suppressed during acid-etching, and also contamination with foreign matter trapped in pits can be prevented. By dissolving the surface of a semiconductor wafer in an amount of at least 4 $\mu$m, pits become small in depth and large in diameter, thereby improving the roughness of an outer circumferential end portion. As a result, a basket becomes less likely to be scraped, and scrapings from a basket become less likely to adhere to pits. Further, even when foreign matter is trapped in pits, it will not remain trapped until the completion of acid-etching.

That is, the present invention provides a method of cleaning a semiconductor wafer after lapping in the manufacture of a semiconductor mirror-polished wafer composed of the steps of slicing a monocrystalline ingot into a semiconductor wafer, and chamfering, lapping, acid-etching, and then mirror-polishing the thus-obtained semiconductor wafer, wherein the semiconductor wafer is cleaned in a strong-alkaline aqueous solution at a point of time after the lapping and before the acid-etching, such that the surface of the semiconductor wafer is dissolved in an amount of at least 4 $\mu$m.

Thus, by cleaning a lapped semiconductor wafer in a strong-alkaline aqueous solution such that the surface of the semiconductor wafer is dissolved in an amount of at least 4 $\mu$m, pits formed in the outer circumferential end portion can be rendered small in depth and large in diameter, so that the roughness of the outer circumferential end portion can be improved. Thus, the generation of a protrusion can be prevented in subsequent acid-etching. Also, even when foreign matter is trapped in pits, there can be avoided the condition that the trapped foreign matter remains as contaminants even after the completion of acid-etching.

In the present invention, so long as the surface of a semiconductor wafer is dissolved in an amount of at least 4 $\mu$m during cleaning in a strong-alkaline aqueous solution, there can be achieved the objects of the present invention, such as suppression of the generation of a protrusion as described above. In the present invention, the upper limit of the amount of dissolution is not particularly limited. However, as the amount of dissolution increases, time required for dissolution increases with a resultant decrease in cleaning efficiency. Thus, the amount of dissolution is preferably up to approximately 50 $\mu$m. However, when the amount of dissolution is in excess of 8 $\mu$m, glossiness of the surface of a semiconductor wafer increases unnecessarily. Thus, the amount of dissolution is particularly preferably 4 $\mu$m to 8 $\mu$m.

Preferably, in the cleaning method of the present invention, the strong-alkaline aqueous solution is an aqueous solution of sodium hydrate or potassium hydrate.

Through use of an aqueous solution of sodium hydrate (hereinafter referred to as NaOH) or potassium hydrate (hereinafter referred to as KOH) as the strong-alkaline aqueous solution, there is enhanced the advantage of the present invention of improved roughness of an outer circumferential end portion which would otherwise be impaired due to selectivity of the strong-alkaline aqueous solution.

Preferably, in the cleaning method of the present invention, the strong-alkaline aqueous solution has a temperature of 40° C. to 90° C.

The temperature of the strong-alkaline aqueous solution is determined to fall within the range of 40° C. to 90° C. because of the following reason. If the temperature of the strong-alkaline aqueous solution is lower than 40° C., the dissolution rate will decrease, resulting in impairment of work efficiency. If the temperature is higher than 90° C., water will evaporate in significant amounts from the strong-alkaline aqueous solution, resulting in difficulty in concentration control. Particularly preferably, the temperature of the strong-alkaline aqueous solution is 40° C. to 55° C.

Preferably, in the cleaning method of the present invention, the concentration of the strong-alkaline aqueous solution is 40 wt. % to 60 wt. %.

The concentration of the strong-alkaline aqueous solution is determined to fall within the range of 40 wt. % to 60 wt. % because of the following reason. If the concentration of the strong-alkaline aqueous solution is lower than 40 wt. %, the surface roughness of a semiconductor wafer will be impaired, resulting in an increase in the amount of polishing in the subsequent mirror polishing step. If the concentration is higher than 60 wt. %, the concentration becomes difficult to control. Particularly preferably, the concentration of the strong-alkaline aqueous solution is 40 wt. % to 50 wt. %.

The cleaning method of the present invention is particularly useful for cleaning silicon wafers, in the manufacture of which a problem is particularly raised by the generation of a protrusion on the outer circumferential end portions thereof during acid-etching.

According to the present invention, there can be sufficiently removed heavy metal, lapping powder, and a rust preventive which have adhered to the surfaces of semiconductor wafers in the lapping step. Also, there can be prevented the generation of a protrusion on the outer circumferential end portions of wafers in the subsequent acid-etching step. Further, contaminants trapped in pits can be prevented from being present even after acid-etching is completed.

DESCRIPTION OF THE PREFERRED EMBODIMENTS

Figure 1:
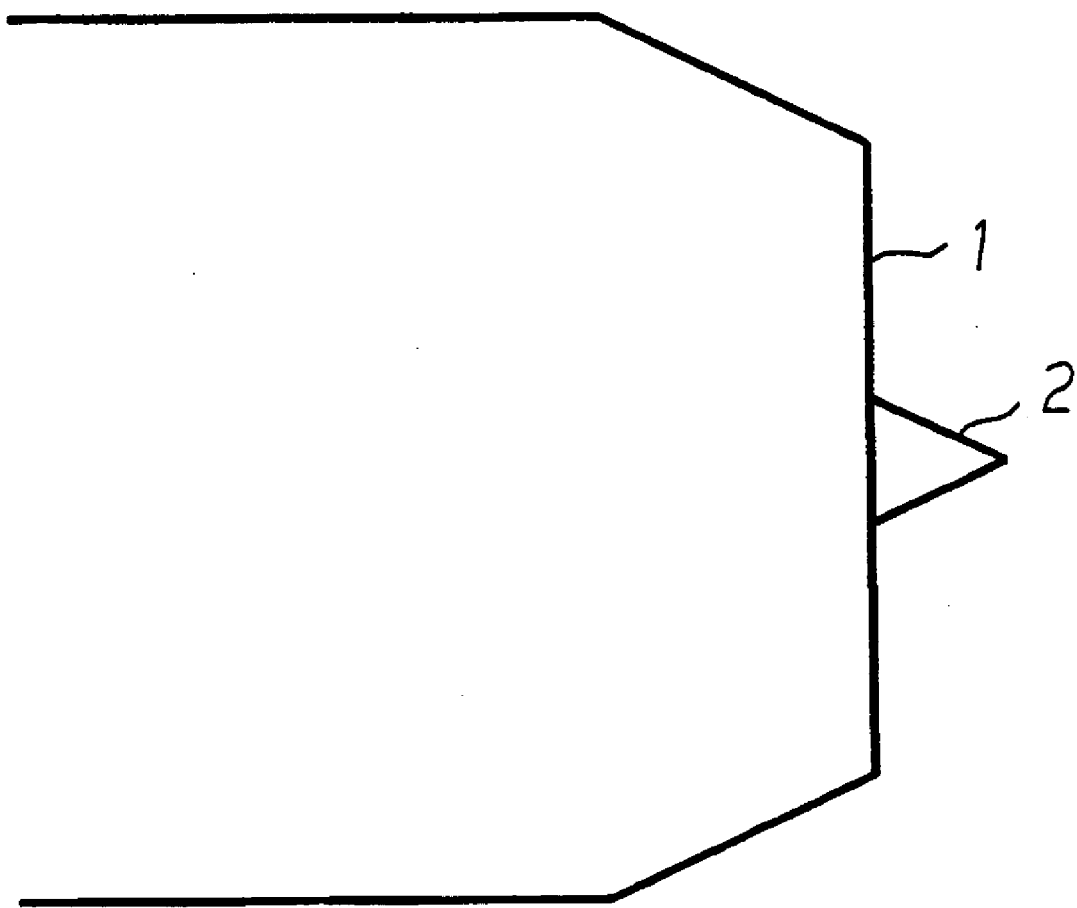
FIG. 1 is a partial sectional view of a semiconductor wafer.

The present invention will be described in detail by way of example.

EXAMPLE AND COMPARATIVE EXAMPLE

Silicon wafers sliced from a single-crystalline silicon ingot were chamfered to obtain 132 silicon wafers having a diameter of 200 mm. Through use of a lapping solution in which lapping powder composed of aluminum oxide is dispersed and which contains a rust preventive, the surfaces of the silicon wafers were lapped in an amount of 80 $\mu$m. Next, 12 of the silicon wafers were left intact, and the rest of the silicon wafers were cleaned in an aqueous solution of NaOH having a temperature of 45° C. and a concentration of 45 wt. % in the following manner. The silicon wafers were divided into 10 groups, each containing 12 wafers. The surfaces of the silicon wafers belonging to each group were dissolved in a corresponding amount selected from 10 kinds of dissolution amounts ranging from 0.1 $\mu$m to 30 $\mu$m as shown in Table 1.

Then, the surfaces of the silicon wafers were rinsed in pure water. Subsequently, the silicon wafers were acid-etched (amount of etching: 15 $\mu$m to 50 $\mu$m) through use of an etchant (hydrofluoric aid:nitric acid:acetic acid=3:5:3). Then, the silicon wafers were rinsed in pure water and examined for the presence of a protrusion on their outer circumferential end portions as well as for surface glossiness.

The results are shown in Table 1. Glossiness was visually examined through comparison with a limit sample indicative of allowable glossiness of wafer surfaces. The mark "O" represents glossiness not higher than that of the limit sample, and the mark "X" represents glossiness higher than that of the limit sample.

TABLE 1

|  | Amount of dissolution ($\mu$m) | Generation of protrusion (number of wafers) Yes | Generation of protrusion (number of wafers) No | Protrusion generation rate (%) | Glossiness |
| --- | --- | --- | --- | --- | --- |
| Comp. | 0 | 0 | 12 | 0 | — |
| Embodiment | 0.1–0.9 | 10 | 2 | 83 | — |
|  | 1.0–1.9 | 10 | 2 | 83 | — |
|  | 2.0–2.9 | 11 | 1 | 92 | — |
|  | 3.0–3.9 | 8 | 4 | 67 | — |
| Embodiment | 4.0–4.9 | 1 | 11 | 8 | O |
|  | 5.0–5.9 | 0 | 12 | 0 | O |
|  | 6.0–6.9 | 0 | 12 | 0 | O |
|  | 7.0–8.0 | 0 | 12 | 0 | O |
|  | 8.1–9.0 | 0 | 12 | 0 | X |
|  | 9.1–30 | 0 | 12 | 0 | X |

As seen from Table 1, when the amount of dissolution is 4.0 $\mu$m or more, the generation of a protrusion on an outer circumferential end portion rarely occurs or does not occur at all. When the amount of dissolution is greater than 8.0 $\mu$m, the glossiness of surface exceeds an allowable value.

The analysis of the surfaces of the cleaned silicon wafers revealed that when the amount of dissolution was 1.0 $\mu$m or more in cleaning in the aqueous solution of NaOH, adhering substances such as heavy metal, lapping powder, and a rust preventive were sufficiently removed.

The present invention is not limited to the above-described embodiment. The above-described embodiment is a mere example, and those having the substantially same structure as that described in the appended claims and providing the similar action and effects are included in the scope of the present invention.

For example, the above embodiment was described while mentioning the cleaning of silicon wafers. However, the present invention is not limited thereto and is applicable to the cleaning of semiconductor wafers of GaAs, GaP, InP, or the like.

Also, the above embodiment was described while mentioning an aqueous solution of NaOH as the strong-alkaline aqueous solution. However, needless to say, the use of an aqueous solution of KOH produces a similar effect.

What is claimed is:

1. A method of cleaning a semiconductor wafer in a manufacturing process of the semiconductor wafer comprising the steps of slicing a monocrystalline ingot into a semiconductor wafer, and chamfering, lapping, acid-etching, and then mirror-polishing the semiconductor wafer,
   said method of cleaning comprising cleaning the semiconductor wafer in a strong-alkaline aqueous solution at a point of time after the lapping and before the acid-etching, such that the surface of the semiconductor wafer is dissolved in an amount of at least 4 $\mu$m in a depth direction of the semiconductor wafer.

2. A method of cleaning a semiconductor wafer according to claim 1, wherein the strong-alkaline aqueous solution is an aqueous solution of sodium hydrate or potassium hydrate.

3. A method of cleaning a semiconductor wafer according to claim 1, wherein the temperature of the strong-alkaline aqueous solution is in the range of 40° C. to 90° C.

4. A method of cleaning a semiconductor wafer according to claim 2, wherein the temperature of the strong-alkaline aqueous solution is in the range of 40° C. to 90° C.

5. A method of cleaning a semiconductor wafer according to claim 1, wherein the concentration of the strong-alkaline aqueous solution is in the range of 40 wt. % to 60 wt. %.

6. A method of cleaning a semiconductor wafer according to claim 2, wherein the concentration of the strong-alkaline aqueous solution is in the range of 40 wt. % to 60 wt. %.

7. A method of cleaning a semiconductor wafer according to claim 3, wherein the concentration of the strong-alkaline aqueous solution is in the range of 40 wt. % to 60 wt. %.

8. A method of cleaning a semiconductor wafer according to claim 4, wherein the concentration of the strong-alkaline aqueous solution is in the range of 40 wt. % to 60 wt. %.

9. A method of cleaning a semiconductor wafer according to claim 1, wherein the semiconductor wafer is a silicon wafer.

10. A method of cleaning a semiconductor wafer according to claim 2, wherein the semiconductor wafer is a silicon wafer.

11. A method of cleaning a semiconductor wafer according to claim 3, wherein the semiconductor wafer is a silicon wafer.

12. A method of cleaning a semiconductor wafer according to claim 4, wherein the semiconductor wafer is a silicon wafer.

13. A method of cleaning a semiconductor wafer according to claim 5, wherein the semiconductor wafer is a silicon wafer.

14. A method of cleaning a semiconductor wafer according to claim 6, wherein the semiconductor wafer is a silicon wafer.

15. A method of cleaning a semiconductor wafer according to claim 7, wherein the semiconductor wafer is a silicon wafer.

16. A method of cleaning a semiconductor wafer according to claim 8, wherein the semiconductor wafer is a silicon wafer.

17. A method of cleaning a semiconductor wafer in a process of manufacturing the semiconductor wafer comprising in the following order: slicing a monocrystalline ingot into a semiconductor wafer, chamfering the semiconductor wafer, lapping the semiconductor wafer, acid-etching the semiconductor wafer, and mirror-polishing the semiconductor wafer;

the method of cleaning comprising cleaning the semiconductor wafer in a strong-alkaline aqueous solution at a point of time after the lapping and before the acid etching, to dissolve the surface of the semiconductor wafer in an amount of at least 4 $\mu$m in a depth direction of the semiconductor wafer.

18. A method of cleaning a semiconductor wafer according to claim 17, wherein the surface of the semiconductor wafer is dissolved in an amount of up to 8 $\mu$m in the depth direction of the semiconductor wafer.

19. A method of cleaning a silicon semiconductor wafer in a process of manufacturing the silicon semiconductor wafer comprising in the following order: slicing a monocrystalline silicon ingot into a silicon semiconductor wafer, chamfering the silicon semiconductor wafer, lapping the silicon semiconductor wafer, acid-etching the silicon semiconductor wafer, and mirror-polishing the silicon semiconductor wafer;

the method of cleaning comprising cleaning the silicon semiconductor wafer in a strong-alkaline aqueous solution at a point of time after the lapping and before the acid etching, to dissolve the surface of the silicon semiconductor wafer in an amount of from 4 $\mu$m to 8 $\mu$m in a depth direction of the silicon semiconductor wafer.

* * * * *